(12) United States Patent
Kim et al.

(10) Patent No.: US 7,795,610 B2
(45) Date of Patent: Sep. 14, 2010

(54) SEMICONDUCTOR LIGHT EMITTING DEVICE

(75) Inventors: Chang Tae Kim, Gyunggi-do (KR); Gi Yeon Nam, Gyunggi-do (KR); Byeong Kyun Choi, Gyunggi-do (KR); Hyun Suk Kim, Gyunggi-do (KR)

(73) Assignee: Epivalley Co., Ltd., Gumi, Gyungbuk (KR)

( * ) Notice: Subject to any disclaimer, the term of this patent is extended or adjusted under 35 U.S.C. 154(b) by 288 days.

(21) Appl. No.: 12/195,741

(22) Filed: Aug. 21, 2008

(65) Prior Publication Data

US 2009/0283789 A1 Nov. 19, 2009

(30) Foreign Application Priority Data

May 15, 2008 (KR) .................. 10-2008-0045182

(51) Int. Cl.
*H01L 29/06* (2006.01)
*H01L 29/12* (2006.01)

(52) U.S. Cl. .................. 257/35; 257/99; 257/773; 257/E33.013; 257/E33.062; 438/29

(58) Field of Classification Search .................. 257/99, 257/103, 773, E21.158, E33.013, E33.062; 438/29, 35
See application file for complete search history.

(56) References Cited

U.S. PATENT DOCUMENTS

| | | | |
|---|---|---|---|
| 5,122,845 A | 6/1992 | Manabe et al. | |
| 5,247,533 A | 9/1993 | Okazaki et al. | |
| 5,290,393 A | 3/1994 | Nakamura | |
| 5,306,662 A | 4/1994 | Nakamura et al. | |
| 5,563,422 A | 10/1996 | Nakamura et al. | |
| 5,733,796 A | 3/1998 | Manabe et al. | |
| 6,194,743 B1 | 2/2001 | Kondoh et al. | |
| 6,307,218 B1 | 10/2001 | Steigerwald et al. | |
| 6,515,306 B2 | 2/2003 | Kuo et al. | |
| 2010/0026198 A1* | 2/2010 | Arai et al. .................. | 315/246 |

FOREIGN PATENT DOCUMENTS

| | | |
|---|---|---|
| KR | 2007-121331 | 12/2007 |
| WO | 2005/022655 | 3/2005 |
| WO | 2005/053042 | 6/2005 |

OTHER PUBLICATIONS

Office Action from Korean Application No. 10-2008-0045182, and its English language translation.

* cited by examiner

*Primary Examiner*—Fernando L Toledo
(74) *Attorney, Agent, or Firm*—Harness, Dickey & Pierce, P.L.C.

(57) ABSTRACT

The present disclosure relates to a semiconductor light emitting device which generates light by recombination of electrons and holes, and which includes: a first finger electrode for supplying one of the electrons and holes, a second finger electrode supplying the other of the electrons and holes, and spaced apart from the first finger electrode at a first interval; and a third finger electrode electrically connected to the first finger electrode, and spaced apart from the second finger electrode at a second interval which is smaller than the first interval.

10 Claims, 7 Drawing Sheets

200mA 300mA 400mA

200mA　　　300mA　　　400mA

SEMICONDUCTOR LIGHT EMITTING DEVICE

CROSS-REFERENCE TO RELATED APPLICATIONS

This application claims the benefit of Korean Patent Application No. 10-2008-0045182 filed May 15, 2008. The entire disclosure of the above application is hereby incorporated by reference.

FIELD

The present disclosure relates to a semiconductor light emitting device, and more particularly, to a semiconductor light emitting device with an electrode structure capable of evenly emitting light.

The III-nitride semiconductor light emitting device means a light emitting device such as a light emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material composed of other group elements, such as SiC, SiN, SiCN and CN, and a semiconductor layer made of such materials.

BACKGROUND

This section provides background information related to the present disclosure which is not necessarily prior art.

FIG. 1 is a view illustrating one example of a conventional III-nitride semiconductor light emitting device. The III-nitride semiconductor light emitting device includes a substrate 100, a buffer layer 200 grown on the substrate 100, an n-type nitride semiconductor layer 300 grown on the buffer layer 200, an active layer 400 grown on the n-type nitride semiconductor layer 300, a p-type nitride semiconductor layer 500 grown on the active layer 400, a p-side electrode 600 formed on the p-type nitride semiconductor layer 500, a p-side bonding pad 700 formed on the p-side electrode 600, an n-side electrode 800 formed on the n-type nitride semiconductor layer exposed by mesa-etching the p-type nitride semiconductor layer 500 and the active layer 400, and a protective film 900.

In the case of the substrate 100, a GaN substrate can be used as a homo-substrate, and a sapphire substrate, a SiC substrate or a Si substrate can be used as a hetero-substrate. However, any type of substrate that can grow a nitride semiconductor layer thereon can be employed. In the case that the SiC substrate is used, the n-side electrode 800 can be formed on the side of the SiC substrate.

The nitride semiconductor layers epitaxially grown on the substrate 100 are grown usually by metal organic chemical vapor deposition (MOCVD).

The buffer layer 200 serves to overcome differences in lattice constant and thermal expansion coefficient between the hetero-substrate 100 and the nitride semiconductor layers. U.S. Pat. No. 5,122,845 mentions a technique of growing an AlN buffer layer with a thickness of 100 to 500 Å on a sapphire substrate at 380 to 800° C. In addition, U.S. Pat. No. 5,290,393 mentions a technique of growing an $Al_{(x)}Ga_{(1-x)}N$ ($0 \leq x < 1$) buffer layer with a thickness of 10 to 5000 Å on a sapphire substrate at 200 to 900° C. Moreover, PCT Publication No. WO/05/053042 mentions a technique of growing a SiC buffer layer (seed layer) at 600 to 990° C., and growing an $In_{(x)}Ga_{(1-x)}N$ ($0 < x \leq 1$) thereon. Preferably, it is provided with an undoped GaN layer with a thickness of 1 to several μm on the AlN buffer layer, $Al_{(x)}Ga_{(1-x)}N$ ($0 \leq x < 1$) buffer layer or SiC/$In_{(x)}Ga_{(1-x)}N$ ($0 < x \leq 1$) layer.

In the n-type nitride semiconductor layer 300, at least the n-side electrode 800 formed region (n-type contact layer) is doped with a dopant. Preferably, the n-type contact layer is made of GaN and doped with Si. U.S. Pat. No. 5,733,796 mentions a technique of doping an n-type contact layer at a target doping concentration by adjusting the mixture ratio of Si and other source materials.

The active layer 400 generates light quanta (light) by recombination of electrons and holes. Normally, the active layer 400 contains $In_{(x)}Ga_{(1-x)}N$ ($0 < x \leq 1$) and has single or multi-quantum well layers. PCT Publication No. WO/02/021121 mentions a technique of doping some portions of a plurality of quantum well layers and barrier layers.

The p-type nitride semiconductor layer 500 is doped with an appropriate dopant such as Mg, and has p-type conductivity by an activation process. U.S. Pat. No. 5,247,533 mentions a technique of activating a p-type nitride semiconductor layer by electron beam irradiation. Moreover, U.S. Pat. No. 5,306,662 mentions a technique of activating a p-type nitride semiconductor layer by annealing over 400° C. PCT Publication No. WO/05/022655 mentions a technique of endowing a p-type nitride semiconductor layer with p-type conductivity without an activation process, by using ammonia and a hydrazine-based source material together as a nitrogen precursor for growing the p-type nitride semiconductor layer.

The p-side electrode 600 is provided to facilitate current supply to the p-type nitride semiconductor layer 500. U.S. Pat. No. 5,563,422 mentions a technique associated with a light transmitting electrode composed of Ni and Au and formed almost on the entire surface of the p-type nitride semiconductor layer 500 and in ohmic-contact with the p-type nitride semiconductor layer 500. In addition, U.S. Pat. No. 6,515,306 mentions a technique of forming an n-type superlattice layer on a p-type nitride semiconductor layer, and forming a light transmitting electrode made of ITO thereon.

Meanwhile, the light transmitting electrode 600 can be formed thick not to transmit but to reflect light toward the substrate 100. This technique is called a flip chip technique. U.S. Pat. No. 6,194,743 mentions a technique associated with an electrode structure including an Ag layer with a thickness over 20 nm, a diffusion barrier layer covering the Ag layer, and a bonding layer containing Au and Al, and covering the diffusion barrier layer.

The p-side bonding pad 700 and the n-side electrode 800 are provided for current supply and external wire bonding. U.S. Pat. No. 5,563,422 mentions a technique of forming an n-side electrode with Ti and Al.

The protection film 900 can be made of $SiO_2$, and may be omitted.

In the meantime, the n-type nitride semiconductor layer 300 or the p-type nitride semiconductor layer 500 can be constructed as single or plural layers. Recently, a technology of manufacturing vertical light emitting devices is introduced by separating the substrate 100 from the nitride semiconductor layers using laser technique or wet etching.

FIG. 2 is a view illustrating one example of an electrode structure described in U.S. Pat. No. 5,563,422. A p-side bonding pad 700 and an n-side electrode 800 are positioned at corner portions of a light emitting device in a diagonal direction. The p-side bonding pad 700 and the n-side electrode 800 are positioned in the farthest portions in the light emitting device to thereby improve current spreading.

FIG. 3 is a view illustrating one example of an electrode structure described in U.S. Pat. No. 6,307,218. According to a tendency toward light emitting devices with large size, finger electrodes 710 and 810 are provided between a p-side bonding pad 700 and an n-side electrode 800 at regular intervals, thereby improving current spreading.

SUMMARY

This section provides a general summary of the disclosure, and is not a comprehensive disclosure of its full scope or all of its features.

In an embodiment of the present disclosure, a semiconductor light emitting device generating light by recombination of electrons and holes comprises a first finger electrode for supplying one of the electrons and holes; a second finger electrode supplying the other of the electrons and holes, and spaced apart from the first finger electrode at a first interval; and a third finger electrode electrically connected to the first finger electrode, and spaced apart from the second finger electrode at a second interval which is smaller than the first interval.

In another embodiment of the present disclosure, a semiconductor light emitting device generating light by recombination of electrons and holes comprises a plurality of finger electrodes for supplying one of the electrons and holes; and at least one finger electrode supplying the other of the electrons and holes, and alternately arranged with the plurality of finger electrodes, wherein an interval between the at least one finger electrode and the finger electrode among the plurality of finger electrodes positioned in the outermost portion of the light emitting device is larger than the other intervals.

Further areas of applicability will become apparent from the description provided herein. The description and specific examples in this summary are intended for purposes of illustration only and are not intended to limit the scope of the present disclosure.

DESCRIPTION OF DRAWINGS

Corresponding reference numerals indicate corresponding parts throughout the several views of the drawings.

DETAILED DESCRIPTION

Figure 1:
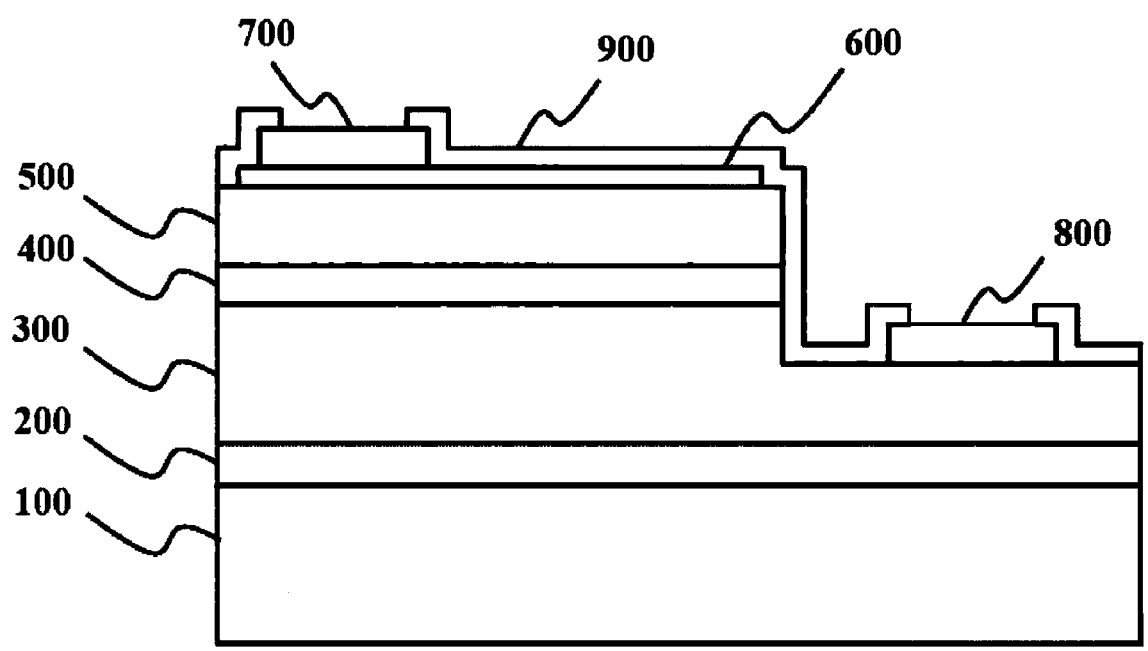
FIG. 1 is a view illustrating one example of a conventional III-nitride semiconductor light emitting device.
Figure 2:
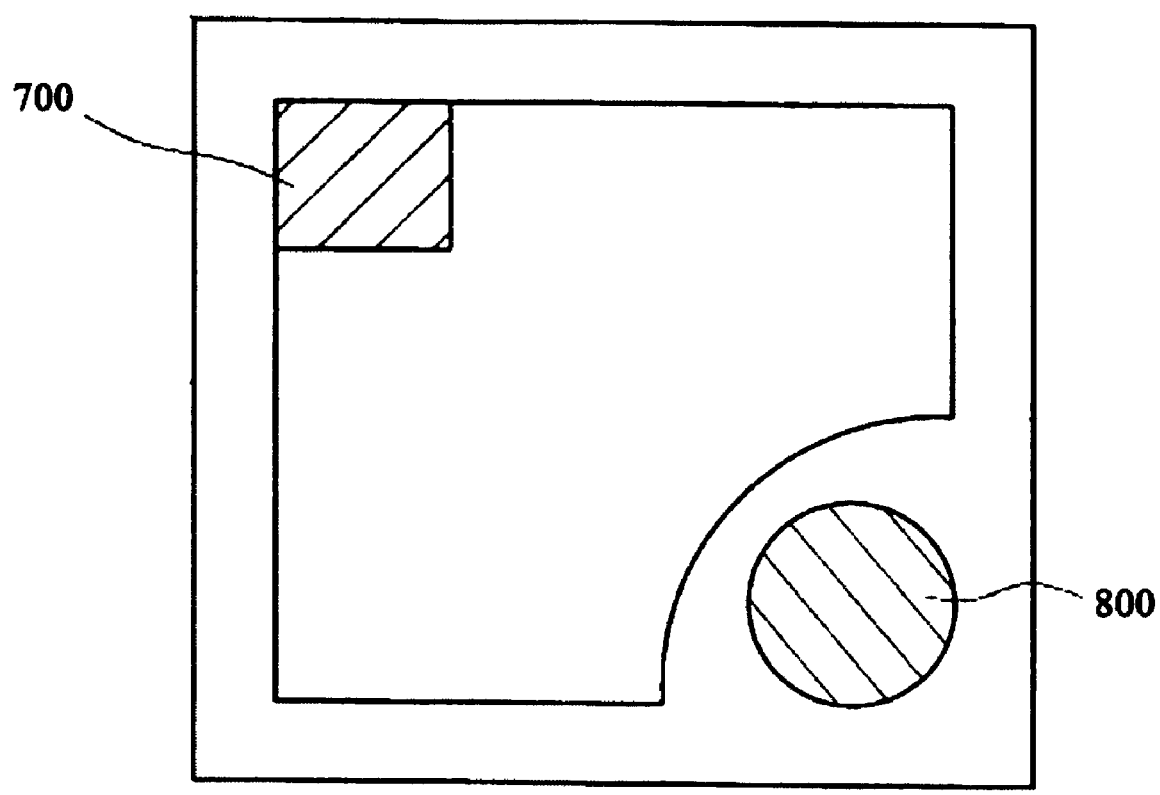
FIG. 2 is a view illustrating one example of an electrode structure described in U.S. Pat. No. 5,563,422.
Figure 3:
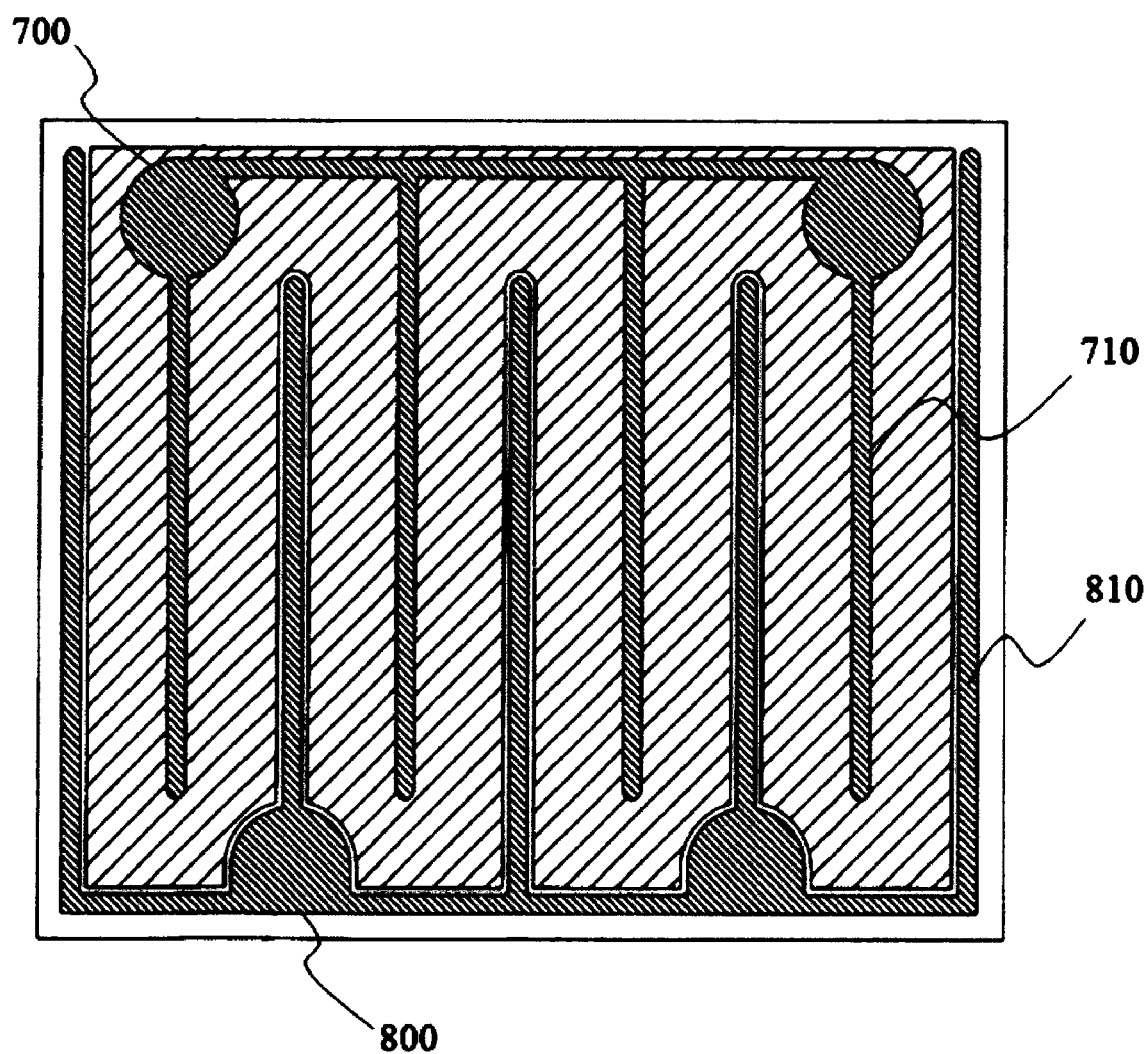
FIG. 3 is a view illustrating one example of an electrode structure described in U.S. Pat. No. 6,307,218.

The present disclosure is to provide a semiconductor light emitting device which can improve current spreading.

In an embodiment, the present disclosure is to provide a semiconductor light emitting device which can evenly emit light.

In another embodiment, the present disclosure is to provide a semiconductor light emitting device which can extend a lifespan.

In yet another embodiment, the present disclosure is to provide a semiconductor light emitting device which can evenly emit light over a wide light emission area.

In the present disclosure, there is provided a semiconductor light emitting device generating light by recombination of electrons and holes, the semiconductor light emitting device, including: a first finger electrode for supplying one of the electrons and holes; a second finger electrode supplying the other of the electrons and holes, and spaced apart from the first finger electrode at a first interval; and a third finger electrode electrically connected to the first finger electrode, and spaced apart from the second finger electrode at a second interval which is smaller than the first interval.

In another aspect of the present disclosure, the semiconductor light emitting device includes a fourth finger electrode electrically connected to the second finger electrode, and spaced apart from the third finger electrode at a third interval which is smaller than the first interval.

In yet another aspect of the present disclosure, the third interval is smaller than the second interval.

In yet another aspect of the present disclosure, the first finger electrode is positioned in the outermost portion of the light emitting device.

In yet another aspect of the present disclosure, the first finger electrode supplies the holes.

In yet another aspect of the present disclosure, the semiconductor light emitting device is a III-nitride semiconductor light emitting device.

In yet another aspect of the present disclosure, there is provided a semiconductor light emitting device generating light by recombination of electrons and holes, the semiconductor light emitting device, including: a plurality of finger electrodes for supplying one of the electrons and holes; and at least one finger electrode supplying the other of the electrons and holes, and alternately arranged with the plurality of finger electrodes, an interval between the at least one finger electrode and the finger electrode positioned in the outermost portion of the light emitting device among the plurality of finger electrodes being larger than the other intervals.

In yet another aspect of the present disclosure, the other intervals are gradually reduced toward the inside of the light emitting device.

In yet another aspect of the present disclosure, the plurality of finger electrodes supply the holes.

In yet another aspect of the present disclosure, the plurality of finger electrodes supply the holes, and the semiconductor light emitting device is a III-nitride semiconductor light emitting device.

According to a semiconductor light emitting device of the present disclosure, the current spreading can be improved.

Also, according to a semiconductor light emitting device of the present disclosure, light can bed evenly emitted.

Also, according to a semiconductor light emitting device of the present disclosure, lifespan of the device can be extended.

Also, according to a semiconductor light emitting device of the present disclosure, light can be evenly emit over a wide emission area.

Example embodiments will now be described more fully with reference to the accompanying drawings.

Figure 4:
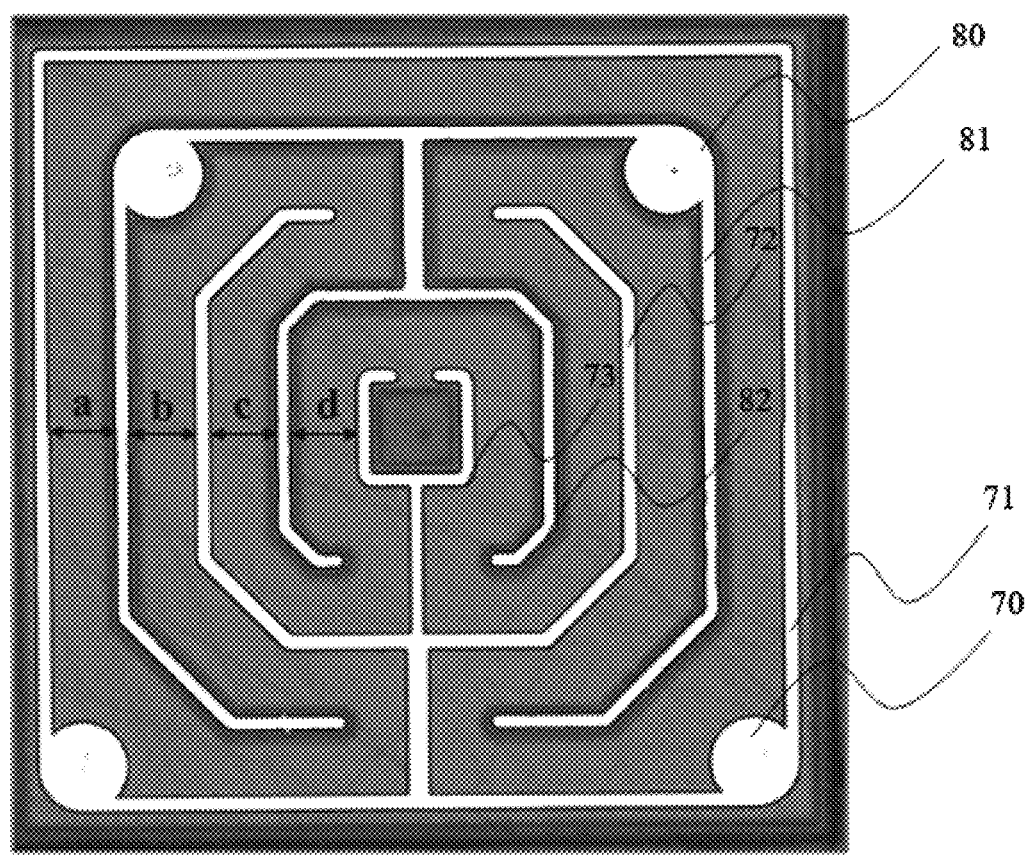
FIG. 4 is a view illustrating one example of a structure of electrodes arranged at regular intervals.

FIG. 4 is a view illustrating an example of a structure of electrodes arranged at regular intervals. A p-side bonding pad 70 and an n-side electrode 80 are provided. Finger electrodes 71, 72 and 73 extend from the p-side bonding pad 70, and finger electrodes 81 and 82 extend from the n-side electrode 80. The finger electrodes 71, 72 and 73 and the finger electrodes 81 and 82 are alternately positioned to supply the current to an entire light emitting device. Intervals a, b, c and d between the finger electrodes 71, 72 and 73 and the finger electrodes 81 and 82 are maintained to be constant.

Figure 5:
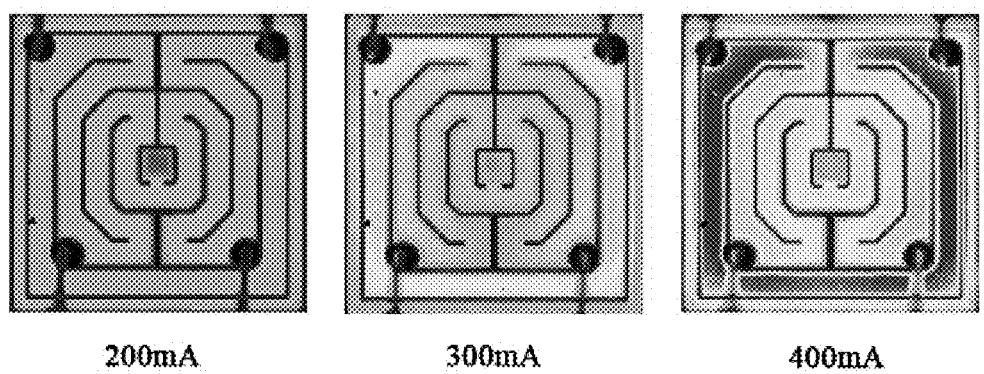
FIG. 5 is a view illustrating light emission distributions in a light emitting device with the electrode structure of FIG. 4.

FIG. 5 is a view illustrating light emission distributions in a light emitting device with the electrode structure of FIG. 4, particularly, light emission distributions when 200 mA, 300 mA and 400 mA of currents are supplied to the same light emitting device. Here, the intervals a, b, c and d (refer to FIG. 4) are maintained at about 89 μm. The light emission between the finger electrode 71 extending from the p-side bonding pad 70 and the finger electrode 81 extending from the n-side electrode 80 is more intense than the light emission between the finger electrode 81 and the finger electrode 72, the light emission between the finger electrode 72 and the finger electrode 82, and the light emission between the finger electrode 82 and the finger electrode 73. The concentration of the light emission and the non-uniformity of the current density may have a detrimental effect on the entire light emission efficiency and lifespan of the light emitting device. Therefore, such problems should be solved. In FIG. 4, when the supplied current increases (generally, when an area of a light emitting device is large, a supplied current is high), the concentration phenomenon becomes serious. Accordingly, the current concentration phenomenon can be a problem particularly in a large-sized light emitting device.

Figure 6:
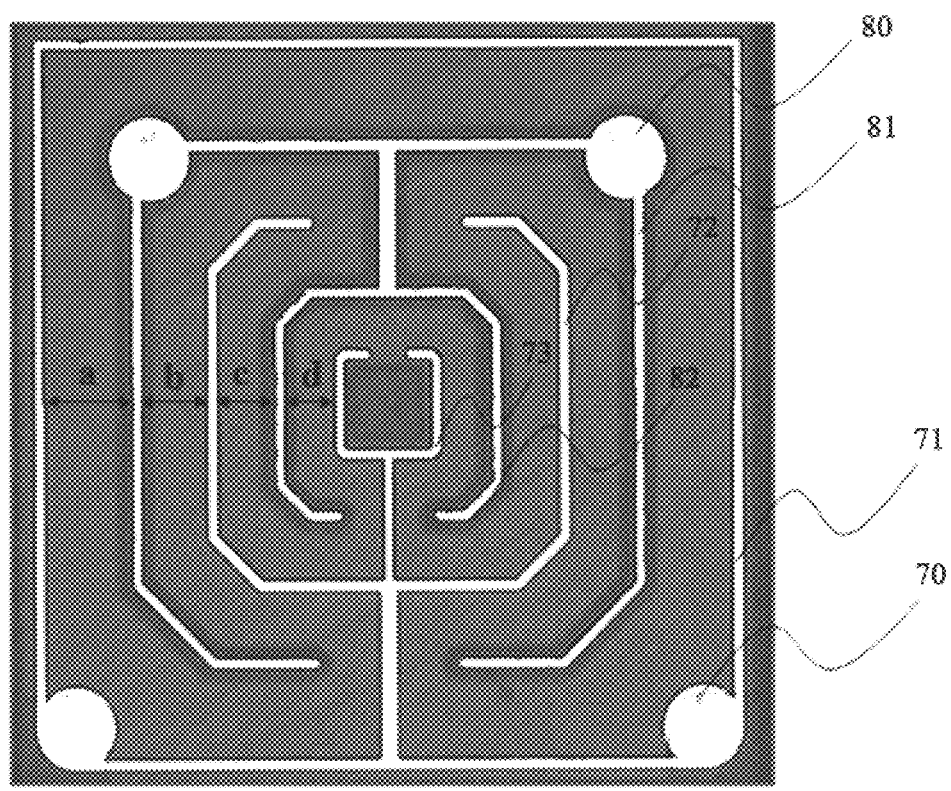
FIG. 6 is a view illustrating one example of an electrode structure according to one embodiment of the present disclosure.

FIG. 6 is a view illustrating an example of an electrode structure according to the present disclosure. A p-side bonding pad 70 and an n-side electrode 80 are provided. Finger electrodes 71, 72 and 73 extend from the p-side bonding pad 70, and finger electrodes 81 and 82 extend from the n-side electrode 80. The finger electrodes 71, 72 and 73 and the finger electrodes 81 and 82 are alternately positioned to supply the current to an entire light emitting device. In a state where the p-side bonding pad 70 and the n-side electrode 80 are maintained as they are in the light emitting device of FIG. 4, intervals a, b, c and d between the finger electrodes 71, 72 and 73 and the finger electrodes 81 and 82 are relatively reduced toward the inside of the light emitting device.

Figure 7:
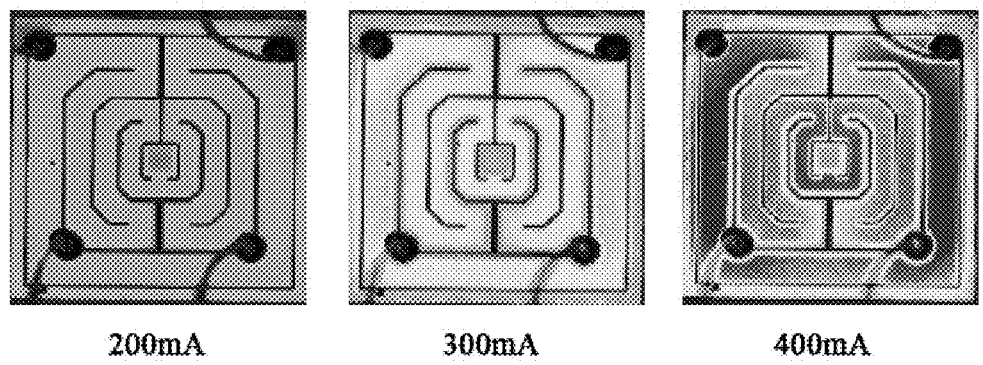
FIG. 7 is a view illustrating light emission distributions in a light emitting device with the electrode structure of FIG. 6.

FIG. 7 is a view illustrating light emission distributions in a light emitting device with the electrode structure of FIG. 6, particularly, light emission distributions when 200 mA, 300 mA and 400 mA of currents are supplied to the same light emitting device. Here, the intervals a, b, c and d (refer to FIG. 6) are 118 μm, 88 μm, 79 μm and 70 μm, respectively. As compared with the light emission distributions of FIG. 5, the light emission between the finger electrode 71 and the finger electrode 81, the light emission between the finger electrode 81 and the finger electrode 72, the light emission between the finger electrode 72 and the finger electrode 82, and the light emission between the finger electrode 82 and the finger electrode 73 are even. That is, the light emission distributions of the light emitting device can be uniformized by adjusting the intervals between the finger electrodes. When 400 mA of current is supplied, the light emission between the finger electrode 82 and the finger electrode 73 is intensified. It can be solved by slightly widening the interval d. Therefore, it should not be construed that the technical ideas of the present disclosure are limited to gradual reduction of the intervals a, b, c and d. That is, in order to overcome the light emission concentration or current concentration occurring when the finger electrodes are arranged at regular intervals, the present disclosure relatively widens an interval in a light emission concentration region, and sets up a narrower interval in a weak light emission region than in an appropriate light emission region in terms of the light emission distribution.

In the light emitting device of FIG. 6, preferably, the p-side bonding pad 70 and the finger electrode 71 are positioned at the outermost portions of the light emitting device, and the n-side electrode 80 and the finger electrode 81 are positioned inwardly. In a case where the n-side electrode 80 and the finger electrode 81 that need to be etched are positioned at the outermost portions of the light emitting device, since the light emitting device are to be etched, a light emission area is reduced. However, when the p-side bonding pad 70 and the finger electrode 71 formed on the light emitting device without needing an etching are positioned at the outermost portions thereof, there is a further advantage of preventing the reduction of the light emission area.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

What is claimed:

1. A semiconductor light emitting device generating light by recombination of electrons and holes, the semiconductor light emitting device, comprising:

a first finger electrode for supplying one of the electrons and holes;

a second finger electrode supplying the other of the electrons and holes, and spaced apart from the first finger electrode at a first interval; and a third finger electrode electrically connected to the first finger electrode, and spaced apart from the second finger electrode at a second interval which is smaller than the first interval.

2. The semiconductor light emitting device of claim 1, comprising:

a fourth finger electrode electrically connected to the second finger electrode, and spaced apart from the third finger electrode at a third interval which is smaller than the first interval.

3. The semiconductor light emitting device of claim 2, wherein the third interval is smaller than the second interval.

4. The semiconductor light emitting device of claim 1, wherein the first finger electrode is positioned in the outermost portion of the light emitting device.

5. The semiconductor light emitting device of claim 4, wherein the first finger electrode supplies the holes.

6. The semiconductor light emitting device of claim 2, wherein the semiconductor light emitting device is a III-nitride semiconductor light emitting device.

7. A semiconductor light emitting device generating light by recombination of electrons and holes, the semiconductor light emitting device, comprising:

a plurality of finger electrodes for supplying one of the electrons and holes; and at least one finger electrode supplying the other of the electrons and holes, and alternately arranged with the plurality of finger electrodes, wherein an interval between the at least one finger electrode and the finger electrode among the plurality of finger electrodes positioned in the outermost portion of the light emitting device is larger than the other intervals.

8. The semiconductor light emitting device of claim 7, wherein the other intervals are gradually reduced toward the inside of the light emitting device.

9. The semiconductor light emitting device of claim 7, wherein the plurality of finger electrodes supply the holes.

10. The semiconductor light emitting device of claim 8, wherein the plurality of finger electrodes supply the holes, the semiconductor light emitting device being a Ill-nitride semiconductor light emitting device.

* * * * *